United States Patent
Choi

(10) Patent No.: US 12,294,799 B2
(45) Date of Patent: May 6, 2025

(54) HIGH DYNAMIC RANGE CMOS IMAGE SENSOR PIXEL WITH REDUCED METAL-INSULATOR-METAL LATERAL OVERFLOW INTEGRATION CAPACITOR LAG

(71) Applicant: OMNIVISION TECHNOLOGIES, INC., Santa Clara, CA (US)

(72) Inventor: Woon Il Choi, Sunnyvale, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 18/670,698

(22) Filed: May 21, 2024

(65) Prior Publication Data
US 2024/0314464 A1 Sep. 19, 2024

Related U.S. Application Data

(63) Continuation of application No. 17/849,325, filed on Jun. 24, 2022, now Pat. No. 12,058,460.

(51) Int. Cl.
*H04N 25/75* (2023.01)
*H04N 25/59* (2023.01)
(Continued)

(52) U.S. Cl.
CPC ............ *H04N 25/75* (2023.01); *H04N 25/59* (2023.01); *H10F 39/18* (2025.01); *H10F 39/8037* (2025.01)

(58) Field of Classification Search
CPC .. H04N 25/75; H04N 25/59; H01L 27/14612; H01L 27/14643
See application file for complete search history.

(56) References Cited

U.S. PATENT DOCUMENTS

| 4,323,986 A | 4/1982 | Malaviya |
| 10,134,788 B2 | 11/2018 | Lyu et al. |

(Continued)

OTHER PUBLICATIONS

Innocent, M., "Modeling, Characterization and Simulation of Dielectric Absorption in Capacitors in Image Sensors", 2021 International Image Sensor Workshop, publication date Sep. 13, 2021 (4 pages).

(Continued)

*Primary Examiner* — Nicholas G Giles
(74) *Attorney, Agent, or Firm* — Perkins Coie LLP; Daniel L. Jackstadt

(57) ABSTRACT

A pixel circuit includes a photodiode configured to photogenerate image charge in response to incident light. A floating diffusion is coupled to receive the image charge from the photodiode. A transfer transistor is coupled between the photodiode and the floating diffusion to transfer the image charge from the photodiode to the floating diffusion. A reset transistor is coupled between a bias voltage source and the floating diffusion. A drain of the reset transistor is coupled to the bias voltage source. The reset transistor is configured to be switched in response to a reset control signal. A lateral overflow integration capacitor (LOFIC) including an insulating region is disposed between a first metal electrode and a second metal electrode. The first metal electrode is coupled to the drain of the reset transistor. The second metal electrode is coupled to a source of the reset transistor and selectively coupled to the floating diffusion.

20 Claims, 4 Drawing Sheets

(51) Int. Cl.
    *H10F 39/00*     (2025.01)
    *H10F 39/18*     (2025.01)

(56) References Cited

U.S. PATENT DOCUMENTS

| | | |
|---|---|---|
| 10,154,222 B2 | 12/2018 | Sugawa et al. |
| 11,140,352 B1 | 10/2021 | Dai et al. |
| 11,212,457 B2 | 12/2021 | Dai et al. |
| 11,348,956 B2 | 5/2022 | Choi et al. |
| 11,399,150 B2 | 7/2022 | Gao et al. |
| 12,058,460 B2 * | 8/2024 | Choi .................. H04N 25/621 |
| 2015/0076330 A1 | 3/2015 | Lyu et al. |
| 2015/0124132 A1 | 5/2015 | Mabuchi et al. |
| 2016/0181314 A1 | 6/2016 | Wan et al. |
| 2017/0324919 A1 | 11/2017 | Lee et al. |
| 2017/0347047 A1 | 11/2017 | Mao et al. |
| 2018/0234652 A1 | 8/2018 | Sugawa et al. |
| 2021/0136275 A1 | 5/2021 | Solhusvik |
| 2021/0144319 A1 * | 5/2021 | Innocent ........... H01L 27/14625 |
| 2021/0168312 A1 | 6/2021 | Madurawe et al. |
| 2021/0183926 A1 | 6/2021 | Choi et al. |
| 2021/0377435 A1 | 12/2021 | Dai et al. |
| 2022/0013554 A1 | 1/2022 | Mun et al. |
| 2023/0164447 A1 | 5/2023 | Wang et al. |
| 2023/0316963 A1 | 10/2023 | Bi |

OTHER PUBLICATIONS

Sakano, Y. et al., "A 132dB Single-Exposure-Dynamic-Range CMOS Image Sensor with High Temperature Tolerance", 2020 IEEE International Solid-State Circuits Conference, Feb. 17, 2020 (22 pages).

\* cited by examiner

HIGH DYNAMIC RANGE CMOS IMAGE SENSOR PIXEL WITH REDUCED METAL-INSULATOR-METAL LATERAL OVERFLOW INTEGRATION CAPACITOR LAG

CROSS-REFERENCE TO RELATED APPLICATIONS

This application is a continuation application of U.S. application Ser. No. 17/849,325, filed Jun. 24, 2022; which is incorporated herein by reference in its entirety.

BACKGROUND INFORMATION

Field of the Disclosure

This disclosure relates generally to image sensors, and in particular but not exclusively, relates to high dynamic range (HDR) complementary metal oxide semiconductor (CMOS) image sensors.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing. The technology used to manufacture image sensors has continued to advance at a great pace. For example, the demands of higher resolution and lower power consumption have encouraged the further miniaturization and integration of these devices.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and photogenerate image charge upon absorption of the image light. The image charge photogenerated by the pixels may be measured as analog output image signals on column bitlines that vary as a function of the incident image light. In other words, the amount of image charge photogenerated is proportional to the intensity of the image light, which are read out as analog signals from the column bitlines and converted to digital values to produce digital images (i.e., image data) that represent the external scene.

Standard image sensors have a limited dynamic range of approximately 60 to 70 dB. However, the luminance dynamic range of the real world is much larger. For instance, natural scenes often span a range of 90 dB and greater. In order to capture details in bright highlights and dim shadows simultaneously, high dynamic range (HDR) technologies have been used in image sensors to increase the captured dynamic range. One common technique to increase dynamic range is to merge multiple exposures captured with different exposure settings using standard (low dynamic range) image sensors into a single linear HDR image, which results in a much larger dynamic range image than a single exposure image.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
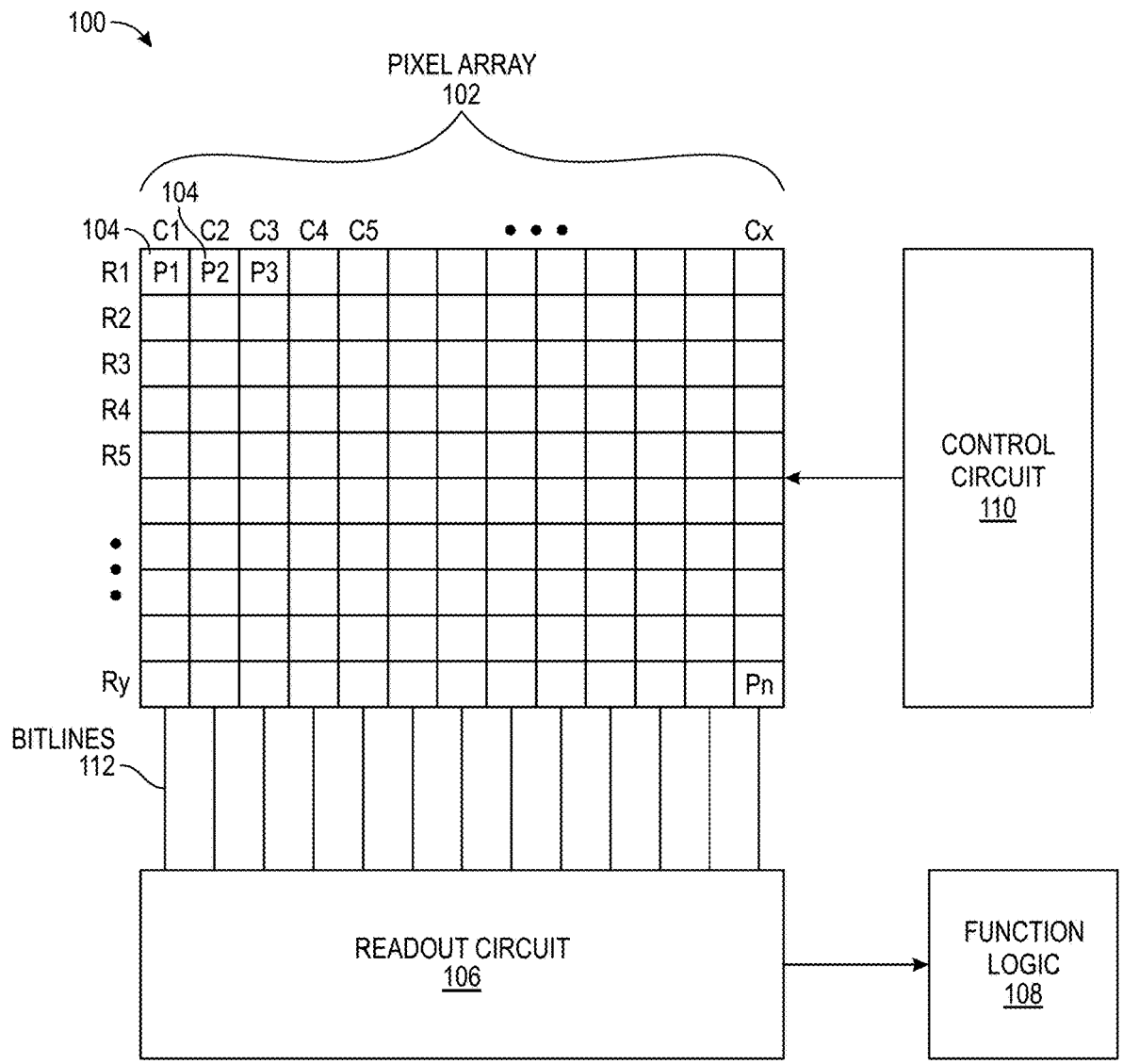
FIG. 1 illustrates one example of an imaging system including a pixel array in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to an imaging system with a pixel array including pixel circuits with LOFICs providing reduced image lag are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under"

can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system include a pixel array with pixel circuits including lateral overflow integration capacitors (LOFICs) configured to provide reduced image lag are disclosed. It is appreciated that LOFICs may be included in pixel circuits to increase the full well capacity of the pixel circuits and thereby increase high dynamic range capabilities of corresponding image sensors. LOFIC capacitance is positively correlated with full well capacity. Thus, as the capacitance of a LOFIC employed in a pixel circuit increases, the full well capacity of the pixel circuit also increases. For this reason, higher LOFIC capacitance is commonly desired. However, due to the huge RC loading that results as the capacitance of a LOFIC increases, the time required for row drivers of the imaging system to charge and/or reset the LOFIC also increases. Consequently, as the capacitances of LOFICs in pixel circuits increase, image lag increases, which causes slower frame rates.

It is appreciated that the image lag caused by LOFICs can be associated with the high dielectric constant or high-k material included in the insulation material of metal-insulator-metal (MIM) LOFICs due to the hysteresis characteristics and slow relaxation behavior of high-k materials that requires long discharge time (e.g., at least a hundred milliseconds), whereas a frame duration for a typical frame rate 30 frames per second is about 33 milliseconds. The high-k material relaxation behavior can cause degraded image quality such as image lag due to many mechanisms including trap-to-trap tunneling, structural relaxation, coupling with phonon energy, etc.

With fixed readout speeds and frame readout speeds of image sensors, it is appreciated that LOFICs included pixel circuits can be reset during idle periods as well as during precharge periods and reset level signal readout operations to reduce image lag in accordance with the teachings of the present invention. Thus, as will be shown in the various examples below, an example pixel circuit includes a photodiode configured to photogenerate image charge during an integration period in response to incident light. A floating diffusion is coupled to receive the image charge from the photodiode during a readout period. A reset transistor is coupled between a bias voltage source and the floating diffusion. The reset transistor is configured to be switched in response to a reset control signal. The pixel circuit also includes a LOFIC to store image charge for high dynamic range (HDR) image acquisition. In the various examples, the LOFIC is metal-insulator-metal (MIM) storage capacitor that includes a high-k insulating region disposed between a first metal electrode and a second metal electrode. In the various examples, the first metal electrode is coupled to a bias voltage source and the second metal electrode is coupled to the reset transistor. In various examples, the reset transistor is turned on to couple both the first metal electrode and the second metal electrode of the LOFIC to the same bias voltage from the bias voltage source during an idle period to auto-zero the LOFIC during the idle period, as well as during a precharge period and during a LOFIC reset during a readout period of the pixel circuit. By forcing the LOFIC to auto-zero during the idle period as will be disclosed, image lag is reduced in accordance with the teachings of the present invention. Further, by forcing the LOFIC to auto-zero during the precharge period and the reset level signal readout period, the LOFIC functions as common metal lines with low parasitic capacitance, and as such, the associated row driver control line (e.g., bias voltage VCAP supplying line) to the LOFIC can be reset without encountering huge RC loading that can reduce horizontal banding noise (H-noise).

To illustrate, FIG. 1 shows one example of an imaging system 100 having a pixel array with pixel circuits including LOFICs providing reduced image lag in accordance with the teachings of the present invention. In particular, the example depicted in FIG. 1 illustrates an imaging system 100 that includes a pixel array 102, bitlines 112, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, each pixel circuit 104 may include one or more photodiodes configured to photogenerate image charge in response to incident light. The image charge generated in the one or more photodiodes is transferred to a floating diffusion included in each pixel circuit 104, which may be converted to an image signal, which is then read out from each pixel circuit 104 by readout circuit 106 through column bitlines 112. As will be discussed, in the various examples, pixel circuits 104 are also be configured to provide HDR image signals, in which case, the image charge generated by the one or more photodiodes in bright lighting conditions may also be transferred to LOFICs and/or an additional floating diffusion in each pixel circuit 104 to store the image charge. For example, each pixel circuit 104 may include a LOFIC configured to store overflow image charge received from coupled one or more photodiodes. In the various examples, readout circuit 106 may be configured to read out the image signals at different conversion gains through column bitlines 112. In various examples, readout circuit 106 may include current sources, routing circuitry, and comparators that may be included in analog to digital converters or otherwise.

In the example, the digital image data values generated by the analog to digital converters in readout circuit 106 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 110 is coupled to pixel array 102 to control operation of the plurality of photodiodes in pixel array 102. For example, control circuit 110 may generate a rolling shutter or a shutter signal for controlling image acquisition. In other examples, image acquisition is synchronized with lighting effects such as a flash.

In one example, imaging system 100 is implemented on a single semiconductor wafer. In another example, imaging system 100 is on stacked semiconductor wafers. For example, pixel array 102 is implemented on a pixel wafer, and readout circuit 106, control circuit 110 and function logic 108 are implemented on an application specific integrated circuit (ASIC) wafer, where the pixel wafer and the ASIC wafer are stacked and interconnected by bonding (hybrid bonding, oxide bonding, or the like) or one or more through substrate vias (TSVs). For another example, pixel array 102 and control circuit 110 are implemented on a pixel wafer, and readout circuit 106, and function logic 108 are implemented on an ASIC wafer, where the pixel wafer and the ASIC wafer are stacked and interconnected via bonding and/or TSVs.

In one example, imaging system 100 may be included in a digital camera, a cell phone, a laptop computer, an endoscope, a security camera, or an imaging device for automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2A:
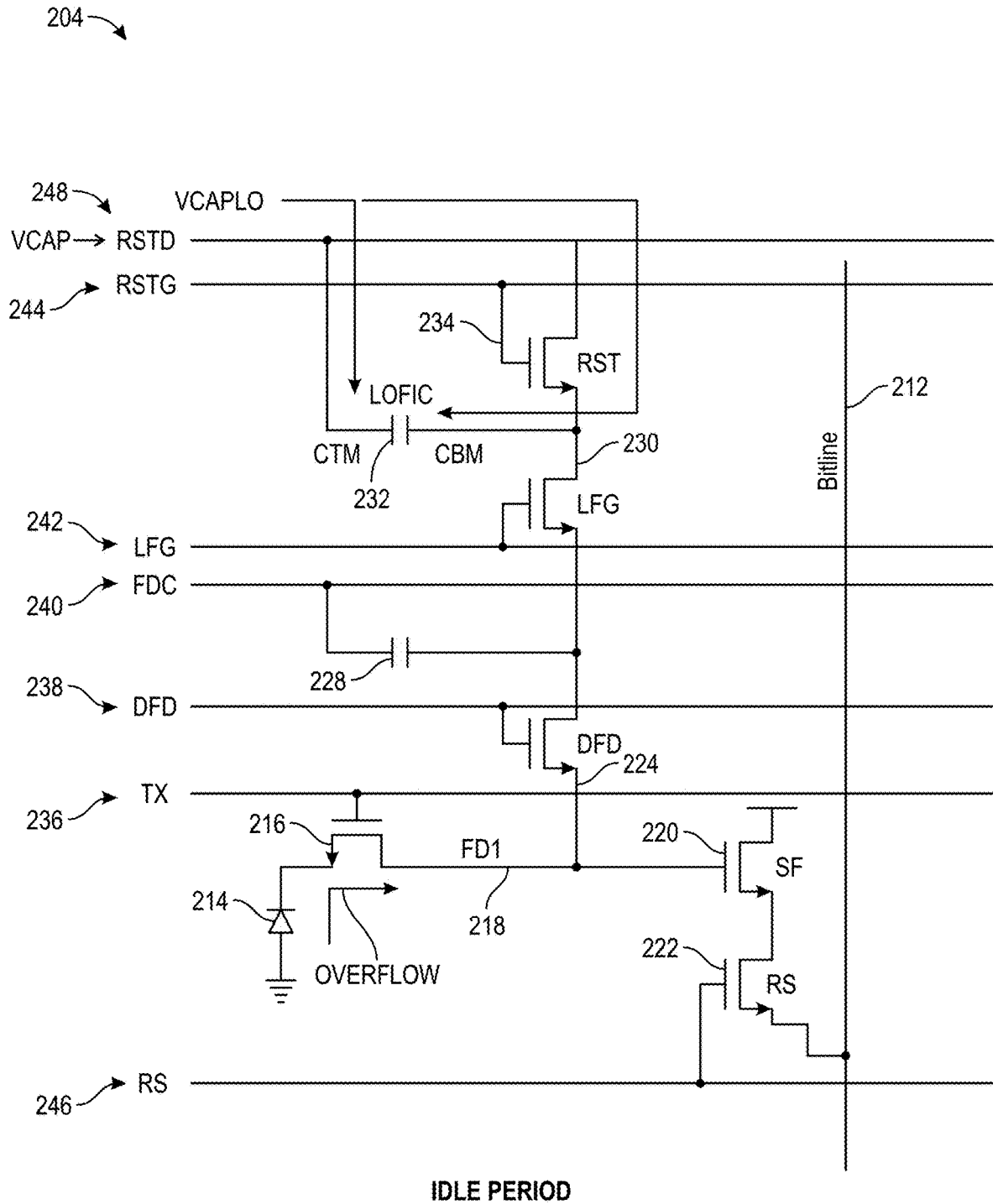
FIG. 2A illustrates a schematic of one example of a pixel circuit including a lateral overflow integration capacitor (LOFIC) during an idle period in accordance with the teachings of the present disclosure.

FIG. 2A illustrates a schematic of one example of a pixel circuit 204 including a LOFIC during an idle period in accordance with the teachings of the present disclosure. It is appreciated that the pixel circuit 204 of FIG. 2A may be an example of one of the pixel circuits 104 included in pixel array 102 as shown in FIG. 1, and that similarly named and numbered elements described above are coupled and function similarly below.

As shown in the depicted example, pixel circuit 204 includes a photodiode 214, which is configured to photogenerate image charge in response to incident light. In the depicted example, pixel circuit 204 also includes a first floating diffusion FD1 218 coupled to receive the image charge from the photodiode 214 through a transfer transistor 216. In the example, the transfer transistor 216 is coupled to be controlled in response to a transfer control signal TX 236 to transfer image charge from the photodiode 214 to the first floating diffusion FD1 218 for example during a readout period associated with the pixel circuit 204. In the example depicted in FIG. 2A, it is noted that during an idle period and an integration period, excess image charge photogenerated in response to the bright lighting conditions is also configured to overflow from the photodiode 214 to the first floating diffusion FD1 218 through the transfer transistor 216. A source follower transistor 220 has a gate coupled to the first floating diffusion FD1 218, and a row select transistor 222 is coupled to the source follower transistor SF 220 such that the source follower transistor 220 and the row select transistor 222 are coupled between a power line and a bitline 212 to output an image signal from the pixel circuit 204 in response to a row select control signal RS 246 and the amount of charge at the gate of the source follower transistor 220.

In the example illustrated in FIG. 2A, a dual floating diffusion DFD transistor 224 is coupled between the first floating diffusion FD1 218 and a second capacitor 228 that is coupled to receive a floating diffusion capacitor signal FDC 240. The second capacitor 228 may be a junction capacitor combined with metal capacitor or metal oxide semiconductor capacitor (MOSCAP) for additional charge storage. The second capacitor 228 is coupled to receive excess image charge overflow from photodiode 214 through transfer transistor 216 and the dual floating diffusion transistor 224. A low conversion gain transistor 230 is coupled between the second capacitor 228 and a reset transistor 234. The reset transistor 234 is coupled between a bias voltage source 248 and the low conversion gain transistor 230. The reset transistor 234 is coupled to be controlled in response to a reset control signal RSTG 244 and the low conversion gain transistor 230 is coupled to be controlled in response to a low conversion control signal LFG 242.

As shown in the example depicted in FIG. 2A, a lateral overflow integration capacitor (LOFIC) 232 is also coupled between the bias voltage source 248 and the low conversion gain transistor 230. As such, the LOFIC 232 is coupled in parallel with the reset transistor RST 234 between the bias voltage source 248 and the low conversion gain transistor 230. The LOFIC 232 is coupled to receive excess image charge overflow from photodiode 214 through transfer transistor 216, the dual floating diffusion transistor 224, and low conversion gain transistor 230. In the example, the LOFIC 232 is implemented with a metal-insulator-metal capacitor including an insulating material with high dielectric constant or high-k insulating material disposed between a first metal electrode and a second metal electrode. In various examples, the insulating material disposed between the first metal electrode and the second metal electrode of the LOFIC 232 may be formed of a single layer of high-k material or a multiple layer stack of high-k material. The exact composition and a thickness of high-k material may depend on the desired LOFIC capacitance. In the various examples, high-k material may include one of aluminum oxide ($Al_2O_3$), Zirconium dioxide ($ZrO_2$), Hafnium oxide (HfO), or a combination thereof. In one example, it is appreciated that the first metal electrode of LOFIC 232 may be referred to as a capacitor top metal (CTM) and the second metal electrode of LOFIC 232 may be referred to as a capacitor bottom metal (CBM).

The LOFIC 232 may have a capacitance higher than the first floating diffusion FD1 218 and the second capacitor 228. In one example, the capacitance (or charge storing capacity) of the first floating diffusion FD1 218 and the capacitance (or charge storing capacity) of the second capacitor 228 are configured to be the same. In another example, the capacitance of the first floating diffusion FD1 218 is configured to be less than the capacitance of the second capacitor 228. The LOFIC 232 may have a charge storage capacity greater than that of the photodiode 214.

During the idle period or the integration period, excess image charge photogenerated in response to strong light conditions (e.g., LED light or IR light), are configured to overflow from the photodiode 214 to the first floating diffusion FD1 218 through the transfer transistor 216 when photodiode 214 saturates, to the second capacitor 228 (additional floating diffusion) through the dual floating diffusion transistor 224 when first floating diffusion FD1 218 is also full, and then to the LOFIC 232 through low conversion gain transistor 230 when the second capacitor 228 is also full.

In operation, the bias voltage source 248 is configured to provide a bias voltage VCAP to the drain of the reset transistor RST 234 as well as the first metal electrode CTM of the LOFIC 232. The second metal electrode CBM of the LOFIC is coupled to the source of the reset transistor RST 234 and the drain of the low conversion gain transistor 230. Furthermore, the reset transistor RST 234 is configured to be turned on in response to the reset control signal RSTG 244 such that a special forced bias or auto-zero across LOFIC 232 during the idle period discharges the LOFIC 232 in accordance with the teachings of the present invention. In operation, both the first and the second metal electrodes (e.g., CTM and CBM) of LOFIC 232 are both locally short circuited together and to the same bias voltage source 248 through the reset transistor RST 234 during the idle period in pixel circuit 204, which forces the LOFIC 232 to discharge, which shortens needed discharge time for LOFIC 232 and reduces the image lag problem in accordance with the teachings of the present invention. In other words, when the reset transistor 234 is turned on, the first and second metal electrodes (e.g., CTM and CBM) of LOFIC 232 are short circuited together as commonly connected metal lines with less loading capacitance on the bias voltage source 248 compared to a loading capacitance of the LOFIC 232 on the bias voltage source 248 when the reset transistor 234 is turned off.

As shown in the depicted example, the bias voltage source 248 is configured to provide a low bias voltage (e.g., VCAPLO) or a high bias voltage (e.g., VCAPHI) to the first metal electrode (e.g., CTM) of LOFIC 232 as well as to the second metal electrode (e.g., CBM) through the reset transistor RST 234 during the idle period to locally auto-zero or force the initiation of a discharge operation of the LOFIC 232 within pixel circuit 204, which reduces image lag in accordance with the teachings of the present invention. In the various examples, the high bias voltage (e.g., VCAPHI) is greater than the low bias voltage (e.g., VCAPLO). In one example, the high bias voltage (e.g., VCAPHI) may be between 2.0V to 3.4V, and the low bias voltage (e.g., VCAPLO) may be between 0V and 2.0V.

Figure 2B:
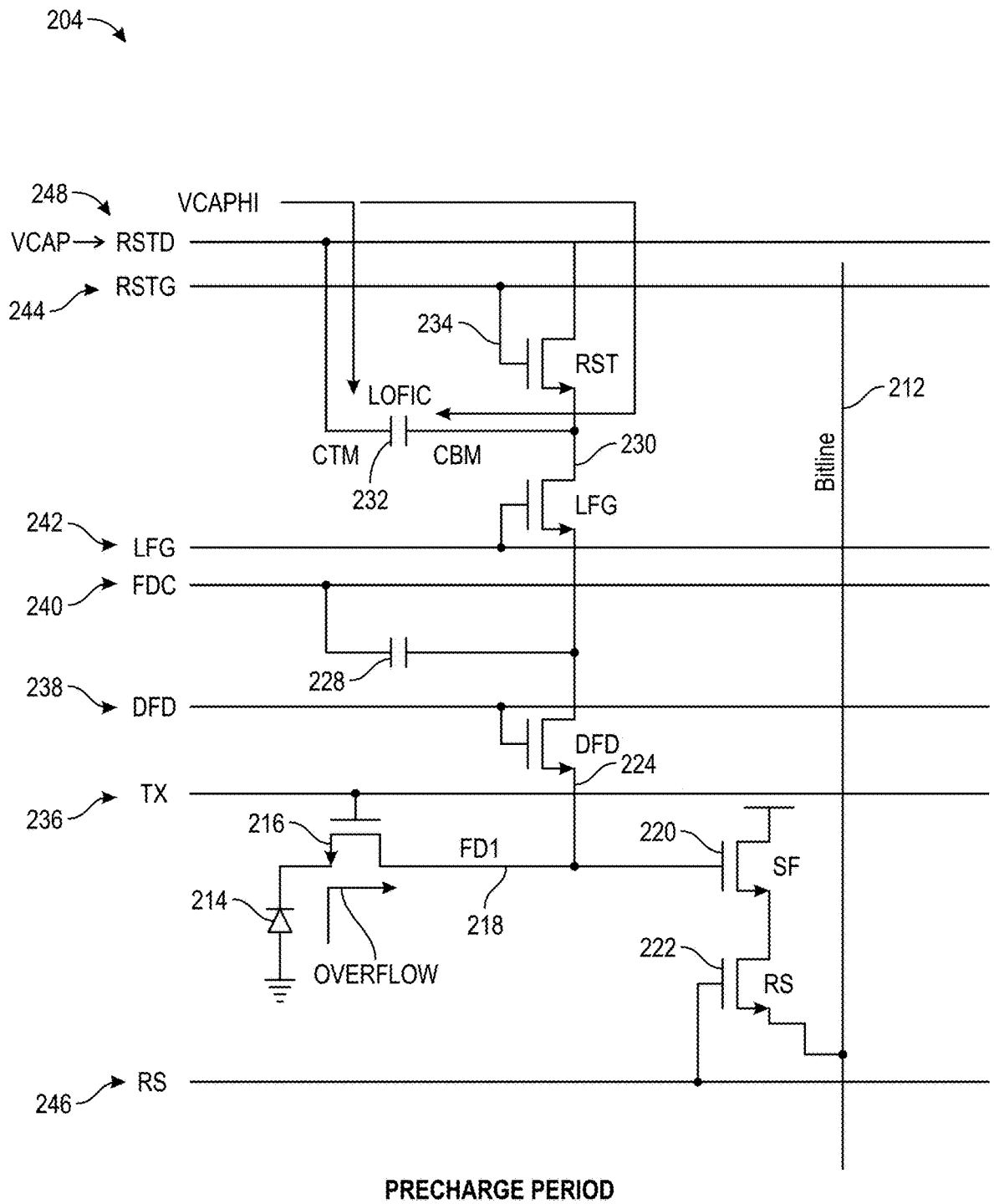
FIG. 2B illustrates a schematic of one example of a pixel circuit including a LOFIC during a precharge period in accordance with the teachings of the present disclosure.

FIG. 2B illustrates a schematic of one example of a pixel circuit 204 including a LOFIC during a precharge period in accordance with the teachings of the present disclosure. It is appreciated that the pixel circuit 204 of FIG. 2B may be an example of one of the pixel circuits 104 included in pixel array 102 as shown in FIG. 1, and that similarly named and numbered elements described above are coupled and function similarly below. It is also appreciated that the pixel circuit 204 depicted in FIG. 2B is substantially similar to the pixel circuit 204 depicted in FIG. 2A discussed in detail above, except that the pixel circuit 204 illustrated in FIG. 2B is depicted during a precharge period, which occurs after the idle period illustrated in FIG. 2A and before an integration period and a readout period.

To illustrate, FIG. 2B shows that pixel circuit 204 includes a photodiode 214 and a first floating diffusion FD1 218 that is coupled to receive the image charge from the photodiode 214 through a transfer transistor 216. In the example, the transfer transistor 216 is coupled to be controlled in response to a transfer control signal TX 236 to transfer image charge from the photodiode 214 to the first floating diffusion FD1 218. In the example, during the integration period, excess image charge photogenerated in response to bright lighting conditions (e.g., LED light or IR light) is also configured to overflow from the photodiode 214 to the first floating diffusion FD1 218 through the transfer transistor 216 when the photodiode 214 saturates, to the second capacitor 228 through the dual floating diffusion DFD transistor 224 when first floating diffusion FD1 218 saturates, and to the LOFIC 232 through low conversion gain transistor 230 when second capacitor 228 also saturates.

A source follower transistor 220 has a gate coupled to the first floating diffusion FD1 218, and a row select transistor 222 is coupled to the source follower transistor SF 220 such that the source follower transistor SF 220 and the row select transistor 222 are coupled between a power line and a bitline 212 to output an image signal from the pixel circuit 204 in response to a row select control signal RS 246 and the amount of charge at the gate of the source follower transistor 220.

In the example illustrated in FIG. 2B, a dual floating diffusion DFD transistor 224 is also coupled between the first floating diffusion FD1 218 and a second capacitor 228 that is coupled to receive a floating diffusion capacitor signal FDC 240. A low conversion gain transistor 230 is coupled between the second capacitor 228 and a reset transistor 234. The reset transistor 234 is coupled between a bias voltage source 248 and the low conversion gain transistor 230. The reset transistor 234 is coupled to be controlled in response to a reset control signal RSTG 244 and the low conversion gain transistor 230 is coupled to be controlled in response to a low conversion control signal LFG 242.

As shown in the example depicted in FIG. 2B, a LOFIC 232 including a first metal electrode CTM and a second metal electrode CBM is also coupled between the bias voltage source 248 and the low conversion gain transistor 230. The first metal electrode CTM of LOFIC 232 is coupled to the bias voltage source 248 and the drain of the reset transistor RST 234, and the second metal electrode CBM of LOFIC 232 is the source of the reset transistor RST 234 and the drain of the low conversion gain transistor 230. In operation, the bias voltage source 248 is configured to provide the bias voltage VCAP to the drain of the reset transistor RST 234 as well as the first metal electrode CTM of the LOFIC 232. Furthermore, during the precharge period (as well as during a LOFIC reset signal readout), the reset transistor RST 234 is configured to be turned on in response to the reset control signal RSTG 244 such that a special forced bias or auto-zero across LOFIC 232 during the precharge period discharges or resets the LOFIC 232 in accordance with the teachings of the present invention. As shown in the example depicted in FIG. 2B, the bias voltage source 248 is configured to provide a high bias voltage (e.g., VCAPHI) to the first metal electrode (e.g., CTM) of LOFIC 232 as well as to the second metal electrode (e.g., CBM) through the reset transistor RST 234 during the precharge period to locally auto-zero or discharge the LOFIC 232 within pixel circuit 204, which reduces image lag in accordance with the teachings of the present invention. In one example, it is also appreciated that the high bias voltage (e.g., VCAPHI) is also utilized for resetting the pixel circuit 204, e.g., resetting photodiode 214, the first floating diffusion FD1 218, and the second capacitor 228 during the precharge period as well as during reset operations that occur during the readout period. As such, it is appreciated therefore that the reset transistor RST 234 is also selectively coupled to the photodiode 214, the first floating diffusion FD1 218, and the second capacitor 228 through the transfer transistor 216, the dual floating diffusion DFD transistor 224, and the low conversion gain transistor 230 as appropriate to reset the photodiode 214, the first floating diffusion FD1 218, and the second capacitor 228 in accordance with the teachings of the present invention.

Figure 3:
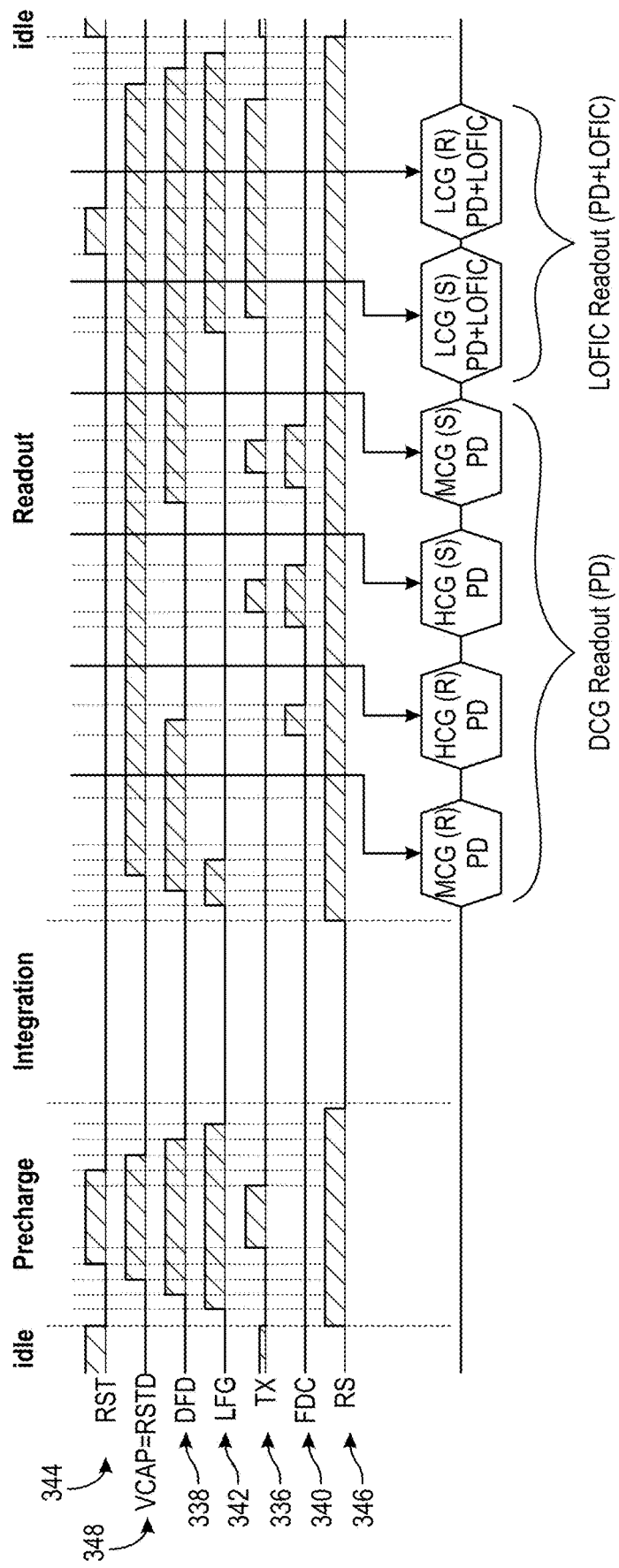
FIG. 3 illustrates one example of a timing diagram of example signal values in an example pixel circuit including a LOFIC during idle, precharge, integration, and readout periods in accordance with the teachings of the present disclosure.

FIG. 3 illustrates one example of a timing diagram of example signal values in an example pixel circuit including a LOFIC during idle, precharge, integration, and readout periods in accordance with the teachings of the present disclosure. It is appreciated that the signals depicted in FIG. 3 may be examples of the signals depicted in FIGS. 2A-2B, and that similarly named and numbered elements described above are coupled and function similarly below.

Referring now to the depicted example, FIG. 3 illustrates a reset control signal RST 344, a bias voltage VCAP 348, a dual floating diffusion control signal DFD 338, a low conversion gain control signal LFG 342, a transfer control signal TX 336, a floating diffusion capacitor signal FDC 340, and a row select control signal RS 346, which are configured to control the respective circuit elements discussed in detail above in FIGS. 2A-2B. The example depicted in FIG. 3 also illustrates the idle, precharge, integration, and readout periods that the pixel circuit cycles through in order when generating image data. In various examples, a control circuit (e.g., control circuit 110 of FIG. 1) is coupled to the pixel circuit and provides the reset control signal RST 344, the dual floating diffusion control signal DFD 338, the low conversion gain control signal LFG 342, the transfer control signal TX 336, the floating diffusion capacitor signal FDC 340, and the row select control signal RS 346 to control the operation of the pixel circuit.

As shown during the idle period depicted in FIG. 3, the reset control signal RST 344 turns on the reset transistor 234, which short circuits both the first and second metal electrodes CTM and CBM of the LOFIC 232 to the bias voltage VCAP 348 through the reset transistor 234 during the idle period. As such, when the reset transistor 234 is turned on, the first and second metal electrodes (e.g., CTM and CBM) of LOFIC 232 are short circuited together as commonly connected metal lines with less loading capacitance on the bias voltage source 248 when the reset transistor 234 is turned on compared to a loading capacitance of the LOFIC 232 on the bias voltage source 248 when the reset transistor 234 is turned off.

In various examples, the idle period may be configured to have a duration in a range between 3 milliseconds to 23 milliseconds based on required auto-zero discharging time needed for the LOFIC 232 and/or needed exposure or integration time. The duration of idle period may be configured to be greater than that the duration of the precharge period. For example, the idle period may be configured to have a duration of 3 milliseconds and the precharge period may be configured to have a duration of less than or equal to 5 microseconds.

By short circuiting both the first and second metal electrodes CTM and CBM of the LOFIC 232 to the bias voltage VCAP 348, the LOFIC 232 is locally auto-zeroed or the initiation of a discharge operation of the LOFIC 232 is forced within pixel circuit 204, which reduces discharging time of LOFIC 232 and issues with image lag in accordance with the teachings of the present invention. The illustrated example also shows that the bias voltage VCAP 348 is equal to a low VCAP value of 0 volts, and that the dual floating diffusion control signal DFD 338, the low conversion gain control signal LFG 342, a transfer control signal TX 336, the floating diffusion capacitor signal FDC 340, and the row select control signal RS 346 are all configured to have low values (e.g., 0 volts) during the idle period. It is appreciated that bias voltage VCAP 348 may also be configured to have high value (e.g., 1.8 to 3 volts). That is, so long that first and second metal electrodes CTM and CBM of the LOFIC 232 are commonly biased to the bias voltage VCAP 348 to initiate discharging process, the bias voltage VCAP can be set to be at either high or low value.

The example depicted in FIG. 3 shows that during the precharge period, which occurs after the idle period, the row select signal RS 346 turns on the row select transistor 222, and then the low conversion gain control signal LFG 342 turns on the low conversion gain transistor 230, and then the dual floating diffusion control signal DFD 338 turns on the dual floating diffusion transistor 224, and then the bias voltage VCAP 348 transitions to a high value (e.g., 2.7 volts), and then the reset control signal RST 344 turns on the reset transistor 244, and then the transfer control signal TX 336 turns on the transfer transistor 216. At this time during the precharge period, the photodiode 214, the first floating diffusion FD1 218, the second capacitor 228, and the LOFIC 232 are all reset through the reset transistor 234 with the bias voltage VCAP 348 set to the high value (e.g., 2.7 volts).

Afterwards, the transfer control signal TX 336 turns off the transfer transistor 216, and then the reset control signal RST 344 turns off the reset transistor 244, and then the bias voltage VCAP 348 transitions to the low value (e.g., 0 volts), and then the dual floating diffusion control signal DFD 338 turns off the dual floating diffusion transistor 224, and then the low conversion gain control signal LFG 342 turns off the low conversion gain transistor 230, and then the row select signal RS 346 turns off the row select transistor 222. It is noted that the reset control signal RST 344 may be configured to transition to a low value to turn off the reset transistor 244 disconnecting the second metal electrodes CBM of LOFIC 232 from VACP line prior to the transition of the bias voltage VCAP 348 to prepare LOFIC 232 for the integration period.

The example depicted in FIG. 3 shows that during the integration period, which occurs after the precharge period, all of the signals are low and integration period occurs, during which time the photodiode 214 generates image charge in response to incident light. Excess photogenerated charges may overflow from the photodiode 214 to the LOFIC 232 through dual floating diffusion transistor 224 and low conversion gain transistor 230 for storage under strong lighting conditions.

The example depicted in FIG. 3 shows that during the readout period, which occurs after the integration period, the row select signal RS 346 turns on the row select transistor 222, and then the low conversion gain control signal LFG 342 turns on the low conversion gain transistor 230, and then the dual floating diffusion control signal DFD 338 turns on the dual floating diffusion transistor 224, and then the bias voltage VCAP 348 transitions to the high value (e.g., 2.7 volts).

Next, a dual conversion gain (DCG) readout of the photodiode occurs during which time a medium conversion gain (MCG) readout of a reset value (R) from the photodiode 214 occurs. Next, the floating diffusion capacitor signal FDC 340 is pulsed while the dual floating diffusion control signal DFD 338 turns off the dual floating diffusion transistor 224. Next, a high conversion gain (HCG) readout of a reset value (R) from the photodiode 214 occurs. Next, the floating diffusion capacitor signal FDC 340 transitions to a high value, and the transfer control signal TX 336 turns on the transfer transistor 216, during which time image charge in the photodiode 214 transfers to the first floating diffusion FD1 218. Next, a high conversion gain (HCG) readout of a signal value (S) may occur. Next, the dual floating diffusion control signal DFD 338 turns on the dual floating diffusion transistor 224, the floating diffusion capacitor signal FDC 340 transitions to a high value, and the transfer control signal TX 336 turns on the transfer transistor 216, during which time image charge in the photodiode 214 transfers to the first floating diffusion FD1 218 and the second capacitor 228. Next, a medium conversion gain (MCG) readout of a signal value (S) may occur.

Next, a LOFIC readout of the photodiode 214 and the LOFIC 232 occurs, during which time the low conversion gain control signal LFG 342 turns on the low conversion gain transistor 230, and then the transfer control signal TX 336 turns on the transfer transistor 216, during which time image charge in the photodiode 214 transfers to the first floating diffusion FD1 218, the second capacitor 228, and the LOFIC 232. Next, a low conversion gain (LCG) readout of a signal value (S) may occur. Next, the reset control signal RST 344 turns on the reset transistor 234, during which time the photodiode 214, the first floating diffusion FD1 218, the second capacitor 228, and the LOFIC 232 are all reset through the reset transistor 234 with the bias voltage VCAP 348 set to the high value (e.g., 2.7 volts). Next, a low conversion gain (LCG) readout of a reset value (R) occurs, after which time the transfer control signal TX 336 turns off the transfer transistor 216, and then the bias voltage VCAP 348 transitions to the low value (e.g., 0~2.0V volts which is driven by VCAPLO), and then the dual floating diffusion control signal DFD 338 turns off the dual floating diffusion transistor 224, and then the low conversion gain control signal LFG 342 turns off the low conversion gain transistor 230.

Next, the process described in FIG. 3 cycles back to an idle period, during which time the LOFIC 232 may be auto-zeroed or discharged again to reduce image lag and the cycle repeats in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel circuit, comprising:
    a photodiode configured to photogenerate image charge in response to incident light;
    a floating diffusion coupled to receive the image charge from the photodiode;
    a transfer transistor coupled between the photodiode and the floating diffusion to transfer the image charge from the photodiode to the floating diffusion;
    a reset transistor coupled between a bias voltage source and the floating diffusion, wherein a drain of the reset transistor is coupled to the bias voltage source, wherein the reset transistor is configured to be switched in response to a reset control signal;
    a source follower transistor having a gate coupled to the floating diffusion; and
    a row select transistor coupled to the source follower transistor, wherein the source follower transistor and the row select transistor are coupled between a power line and a bitline; and
    a lateral overflow integration capacitor (LOFIC) including an insulating region disposed between a first metal electrode and a second metal electrode, wherein the first metal electrode is coupled to the drain of the reset transistor, wherein the second metal electrode is coupled to a source of the reset transistor and selectively coupled to the floating diffusion,
    wherein the reset control signal is configured to turn on the reset transistor to couple the second metal electrode to the first metal electrode to discharge the LOFIC during an idle period occurring before an integration period,
    wherein the row select transistor is configured to be switched in response to a row select control signal, and wherein the row select control signal is configured to turn off the row select transistor during the idle period.

2. The pixel circuit of claim 1, wherein the power line is different from the bias voltage source.

3. The pixel circuit of claim 2, wherein the pixel circuit is configured to cycle through a plurality of periods in order when generating image data, wherein the plurality of periods in order are the idle period, a precharge period, the integration period, and a readout period, wherein after the readout period, the pixel circuit is configured to cycle back to the idle period, wherein the reset control signal is further configured to turn on the reset transistor to couple the second metal electrode to the first metal electrode to discharge the LOFIC during the precharge period.

4. The pixel circuit of claim 3, wherein the first metal electrode and the second metal electrode are short circuited together as commonly connected metal lines with less loading capacitance on the bias voltage source when the reset transistor is turned on compared to a loading capacitance of the LOFIC on the bias voltage source when the reset transistor is turned off.

5. The pixel circuit of claim 3, wherein the reset control signal is configured to turn on the reset transistor to couple the second metal electrode to the first metal electrode to discharge the LOFIC while resetting the pixel circuit during the readout period prior to a readout of a reset signal value from the LOFIC.

6. The pixel circuit of claim 5, wherein a variable bias voltage provided by the bias voltage source is configured to equal a first bias voltage during the idle period, wherein the variable bias voltage is configured to equal a second bias voltage during the precharge period, wherein the second bias voltage is greater than the first bias voltage.

7. The pixel circuit of claim 6, wherein the variable bias voltage provided by the bias voltage source is configured to equal the second bias voltage during the readout period.

8. The pixel circuit of claim 3, further comprising a dual floating diffusion (DFD) transistor coupled between the floating diffusion and the second metal electrode, wherein the DFD transistor is configured to be switched in response to a DFD control signal, wherein the DFD control signal is configured to turn off the DFD transistor during the idle period.

9. The pixel circuit of claim 8, wherein the LOFIC is a first capacitor, wherein the pixel circuit further comprises:
    a second capacitor, wherein the DFD transistor is coupled between the floating diffusion and the second metal electrode, wherein the DFD transistor is coupled between the floating diffusion and the second capacitor; and
    a low conversion gain (LFG) transistor coupled between the second capacitor and the second metal electrode, wherein the LFG transistor is configured to be switched in response to an LFG control signal, wherein the LFG control signal is configured to turn off the LFG transistor during the idle period.

10. An imaging system, comprising:
    a pixel array including a plurality of pixel circuits arranged in a plurality of rows and a plurality of columns, wherein each one of the plurality of pixel circuits includes:

a photodiode configured to photogenerate image charge in response to incident light;

a floating diffusion coupled to receive the image charge from the photodiode;

a transfer transistor coupled between the photodiode and the floating diffusion to transfer the image charge from the photodiode to the floating diffusion;

a reset transistor coupled between a bias voltage source and the floating diffusion, wherein a drain of the reset transistor is coupled to the bias voltage source, wherein the reset transistor is configured to be switched in response to a reset control signal;

a source follower transistor having a gate coupled to the floating diffusion; and a row select transistor coupled to the source follower transistor, wherein the source follower transistor and the row select transistor are coupled between a power line and a bitline; and a lateral overflow integration capacitor (LOFIC) including an insulating region disposed between a first metal electrode and a second metal electrode, wherein the first metal electrode is coupled to the drain of the reset transistor, wherein the second metal electrode is coupled to a source of the reset transistor and selectively coupled to the floating diffusion, wherein the reset control signal is configured to turn on the reset transistor to couple the second metal electrode to the first metal electrode to discharge the LOFIC during an idle period occurring before an integration period, wherein the row select transistor is configured to be switched in response to a row select control signal, and wherein the row select control signal is configured to turn off the row select transistor during the idle period;

a control circuitry coupled to the pixel array to control operation of the pixel array; and a readout circuitry coupled to the pixel array to read out image data from the plurality of pixel circuits.

11. The imaging system of claim 10, wherein the power line is different from the bias voltage source.

12. The imaging system of claim 11, wherein each one of the plurality of pixel circuits is configured to cycle through a plurality of periods in order when generating the image data, wherein the plurality of periods in order are the idle period, a precharge period, the integration period, and a readout period, wherein after the readout period, each one of the plurality of pixel circuits is configured to cycle back to the idle period, wherein the reset control signal is further configured to turn on the reset transistor to couple the second metal electrode to the first metal electrode to discharge the LOFIC during the precharge period.

13. The imaging system of claim 12, wherein the reset control signal is configured to turn on the reset transistor to couple the second metal electrode to the first metal electrode to discharge the LOFIC while resetting each one of the plurality of pixel circuits during the readout period prior to a readout of a reset signal value from the LOFIC.

14. The imaging system of claim 13, wherein a variable bias voltage provided by the bias voltage source is configured to equal a first bias voltage during the idle period, wherein the variable bias voltage is configured to equal a second bias voltage during the precharge period, wherein the second bias voltage is greater than the first bias voltage.

15. The imaging system of claim 14, wherein the variable bias voltage provided by the bias voltage source is configured to equal the second bias voltage during the readout period.

16. The imaging system of claim 12, wherein each one of the plurality of pixel circuits further comprises a dual floating diffusion (DFD) transistor coupled between the floating diffusion and the second metal electrode, wherein the DFD transistor is configured to be switched in response to a DFD control signal, wherein the DFD control signal is configured to turn off the DFD transistor during the idle period.

17. The imaging system of claim 16, wherein the LOFIC is a first capacitor, wherein each one of the plurality of pixel circuits further comprises:

a second capacitor, wherein the DFD transistor is coupled between the floating diffusion and the second capacitor; and a low conversion gain (LFG) transistor coupled between the second capacitor and the second metal electrode, wherein the LFG transistor is configured to be switched in response to an LFG control signal, wherein the LFG control signal is configured to turn off the LFG transistor during the idle period.

18. An imaging system, comprising:

a pixel array including a plurality of pixel circuits arranged in a plurality of rows and a plurality of columns, wherein each one of the plurality of pixel circuits includes:

a photodiode configured to photogenerate image charge in response to incident light;

a floating diffusion coupled to receive the image charge from the photodiode;

a transfer transistor coupled between the photodiode and the floating diffusion to transfer the image charge from the photodiode to the floating diffusion;

a reset transistor, wherein a drain of the reset transistor is coupled to receive a bias voltage, wherein a source of the reset transistor is coupled to the floating diffusion, wherein the reset transistor is configured to be switched in response to a reset control signal;

a lateral overflow integration capacitor (LOFIC) including an insulating region disposed between a first metal electrode and a second metal electrode, wherein the reset transistor is configured to selectively couple the first metal electrode to the second metal electrode in response to the reset control signal;

a source follower transistor having a gate coupled to the floating diffusion; and a row select transistor coupled to the source follower transistor, wherein the source follower transistor and the row select transistor are coupled between a power line and a bitline, wherein the row select transistor is configured to be switched in response to a row select control signal;

a control circuitry coupled to the pixel array to control operation of the pixel array; and a readout circuitry coupled to the pixel array to read out image data from the plurality of pixel circuits, wherein at least one of the plurality of pixel circuits is configured to cycle through a plurality of periods in order when generating the image data, wherein the plurality of periods in order are an idle period, a precharge period, an integration period, and a readout period, wherein after the readout period, the at least one of the plurality of pixel circuits is configured to cycle back to the idle period, wherein during the idle period of the at least one of the plurality of pixel circuits, the reset control signal is configured to turn on the reset transistor coupling the first metal electrode and the second metal electrode to receive the bias voltage discharging the LOFIC while the row select control signal is configured to turn off the row select transistor.

19. The imaging system of claim 18, wherein each one of the plurality of pixel circuits further comprises a dual floating diffusion (DFD) transistor coupled between the floating diffusion and the second metal electrode, wherein the DFD transistor is configured to be switched in response to a DFD control signal, wherein the DFD control signal is configured to turn off the DFD transistor during the idle period of the at least one of the plurality of pixel circuits.

20. The imaging system of claim 19, wherein the LOFIC is a first capacitor, wherein each one of the plurality of pixel circuits further comprises:
 a second capacitor, wherein the DFD transistor is coupled between the floating diffusion and the second capacitor; and
 a low conversion gain (LFG) transistor coupled between the second capacitor and the second metal electrode, wherein the LFG transistor is configured to be switched in response to an LFG control signal, wherein the LFG control signal is configured to turn off the LFG transistor during the idle period of the at least one of the plurality of pixel circuits.

* * * * *